United States Patent [19]
Choy et al.

[11] Patent Number: 5,882,211
[45] Date of Patent: Mar. 16, 1999

[54] SYSTEM FOR ARRANGING A PAIR OF OPPOSITE CONNECTORS

[75] Inventors: Edmond Choy, Union City; Caesar Chen, Fountain Valley, both of Calif.

[73] Assignee: Hon Hai Precision Ind. Co., Ltd, Taipei Hsien, Taiwan

[21] Appl. No.: 858,218

[22] Filed: May 10, 1997

[51] Int. Cl.$^6$ ...................................................... H01R 9/09
[52] U.S. Cl. .......................... 439/74; 439/540.1; 439/633
[58] Field of Search .................................. 439/74, 540.1, 439/631, 633, 638, 654, 637, 326, 59, 62

[56] References Cited

U.S. PATENT DOCUMENTS

| | | | |
|---|---|---|---|
| 4,295,695 | 10/1981 | Dodds | 439/74 |
| 4,618,196 | 10/1986 | Muzslay | 439/654 |
| 5,514,002 | 5/1996 | Cheng et al. | 439/637 |
| 5,688,147 | 11/1997 | Coteus et al. | 439/633 |

*Primary Examiner*—Neil Abrams
*Assistant Examiner*—Barry M. L. Standig

[57] ABSTRACT

A system (10) for interconnecting two modules (100, 100') to the CPU chip, includes two opposite connectors (12, 14) in a head-to-head arrangement. The traces (200) each of which connects the two corresponding contacts 28/30 and 30'/28' each being located in the same position of the corresponding connector (12, 14), are generally arranged in a parallel relationship. One (12) of the connectors (12, 14) is substantially a standard one which meets the requirements defined in the general specification. The other (14) of the connectors (12, 14) is generally, but not exactly, of a mirror image with regard to the first one (12), wherein the positions of the two-row contacts (28'/30') with regard to the housing (16') along the lengthwise direction of the second connector (14) are arranged in an opposite relationship with regard to those in the first connector (12). When used, a standard module (100) can be inserted into the first connector (12) in a common way with its upside surface (106) facing up, or can be inserted into the second connector (14) in an opposite way with its back surface (108) facing up, whereby the pads (P1–P144) printed on both surfaces (106, 108) of the module (100, 100') can be respectively properly electrically connected to the corresponding traces (200) regardless of which connector (12, 14) it is inserted into.

12 Claims, 10 Drawing Sheets

SYSTEM FOR ARRANGING A PAIR OF OPPOSITE CONNECTORS

BACKGROUND OF THE INVENTION

1. Field of the Invention

The invention relates an interconnection system including at least a pair of opposite connectors, which are adapted to receive a pair of corresponding modules therein, wherein between this pair of connector, the conductive traces connected to the corresponding contacts are arranged in a parallel relationship.

2. The Related Art

SO DIMMs (Small Out-line Dual In-line Memory Modules) are popularly used in the computer field, so that the corresponding connectors are also desired to be installed within the computer as an interface device for connecting the modules to the mother board, as shown in U.S. Pat. No. 5,514,002. Recently, more than one modules are required within one computer for efficient signal transmission. One approach is to use two stacked connectors on the mother board to respectively receive the corresponding two modules, as shown in the application Ser. No. 08/393,704 filed Feb. 24, 1995. Another approach is to directly mount two connectors on the mother board, respectively. The former increases the height of the mother board assembly, and also makes it difficult to solder the longer contact tails of the plural contacts of the upper connector with regard to the mother board. The latter as shown in FIG. 1 generally has the two connectors arranged in a front-to-end aligning manner wherein the same positioned two contacts in the two respective connectors are aligned with each other and sharing the same trace 200 which is eventually connected to one corresponding lead of the CPU chip, according to the circuit layout design of the PC board. The distance between these two corresponding contacts is substantially relatively long because these two contacts are spaced from each other by at least the length of the side arm 201 of the front connector. As understood, the longer the trace is, the more the antenna effect occurs, thus making more noise during transmission. It can be understood that a side-by-side arrangement for these two connectors, as shown in FIG. 2, also creates longer traces 200 between a pair of corresponding contacts each located in the same position in the respective connector.

Therefore, an object of the invention is to provide an interconnection system which includes two connectors whereby the traces interconnecting two corresponding contacts having the same position with regard to the two connectors, respectively, are relatively short to prevent themselves from creating unnecessary noise.

SUMMARY OF THE INVENTION

According to an aspect of the invention, a system for interconnecting two modules to the CPU chip, includes two opposite connectors in a head-to-head arrangement. The traces each of which connects the two corresponding contacts each being located in the same position of the corresponding connector, are generally arranged in a parallel relationship. One of the connectors is substantially a standard one which meets the requirements defined in the general specification. The other of the connectors is generally, but not exactly, of a mirror image with regard to the first one, wherein the positions of the two-row contacts with regard to the housing along the lengthwise direction of the second connector are arranged in an opposite relationship with regard to those in the first connector. When used, a standard module can be inserted into the first connector in a common way with its upper surface facing up, or can be inserted into the second connector in an opposite way with its back surface facing up, whereby the pads printed on both surfaces of the module can be respectively properly electrically connected to the corresponding traces regardless of which connector it is inserted into.

BRIEF DESCRIPTION OF THE DRAWINGS

FIG. 3(A) is an enlarged partial plan view of the housing of the connector of FIG. 3 to show the offset relation between the upper row passageways and lower row passageways.

FIG. 3(B) is a plan view to show the upper row contact and the lower row contact of the first connector of FIG. 3.

FIG. 3(C) is a plan view to show the upper row contact and the lower row contact of the second connector of FIG. 3.

DETAILED DESCRIPTION OF THE PREFERRED EMBODIMENTS

References will now be in detail to the preferred embodiments of the invention. While the present invention has been described in with reference to the specific embodiments, the description is illustrative of the invention and is not to be construed as limiting the invention. Various modifications to the present invention can be made to the preferred embodiments by those skilled in the art without departing from the true spirit and scope of the invention as defined by appended claims.

Figure 1:
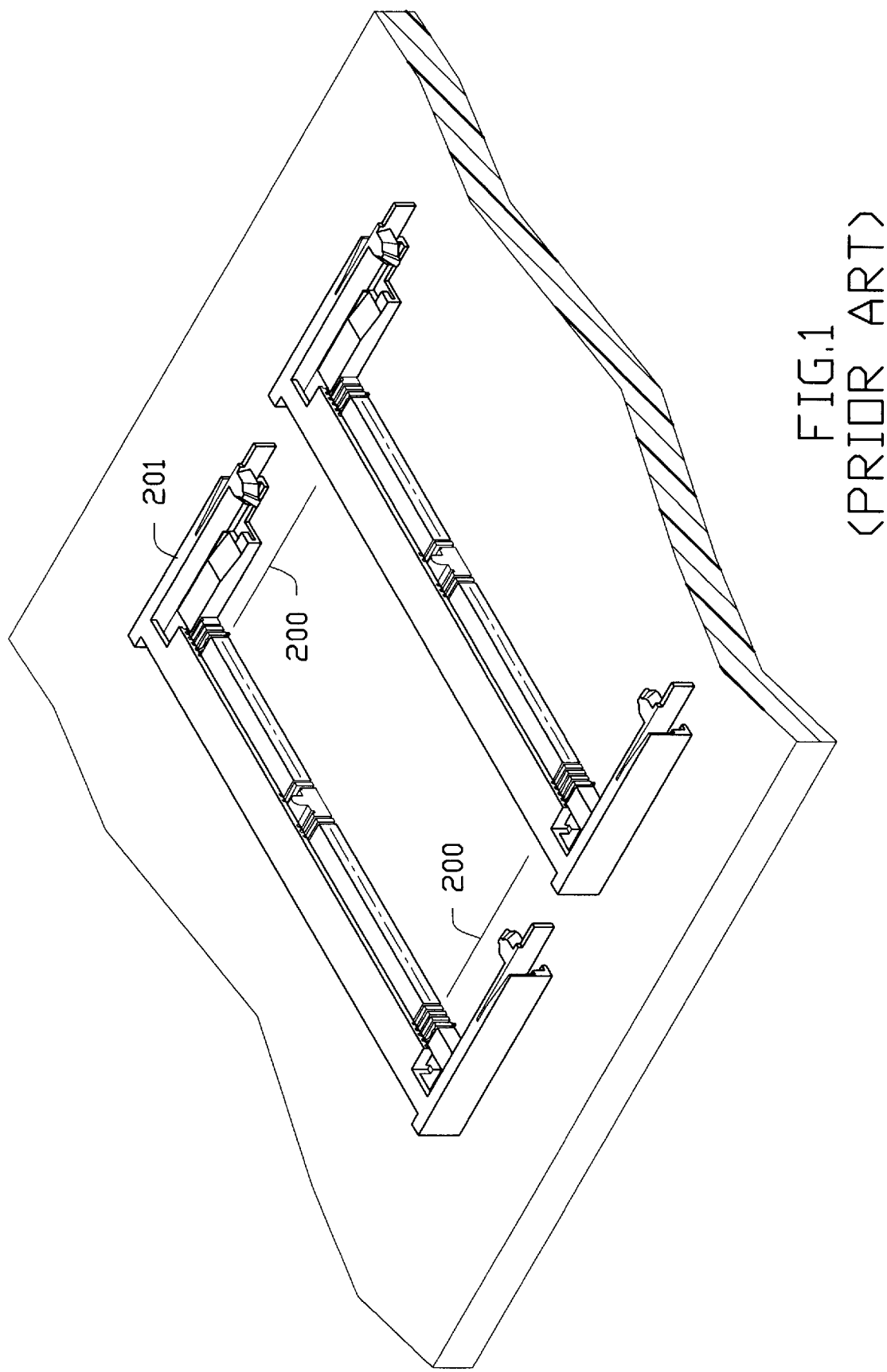
FIG. 1 is a perspective view of a pair of connectors mounted on a PC board with an aligned head-to-tail relationship, according to the prior art.
Figure 2:
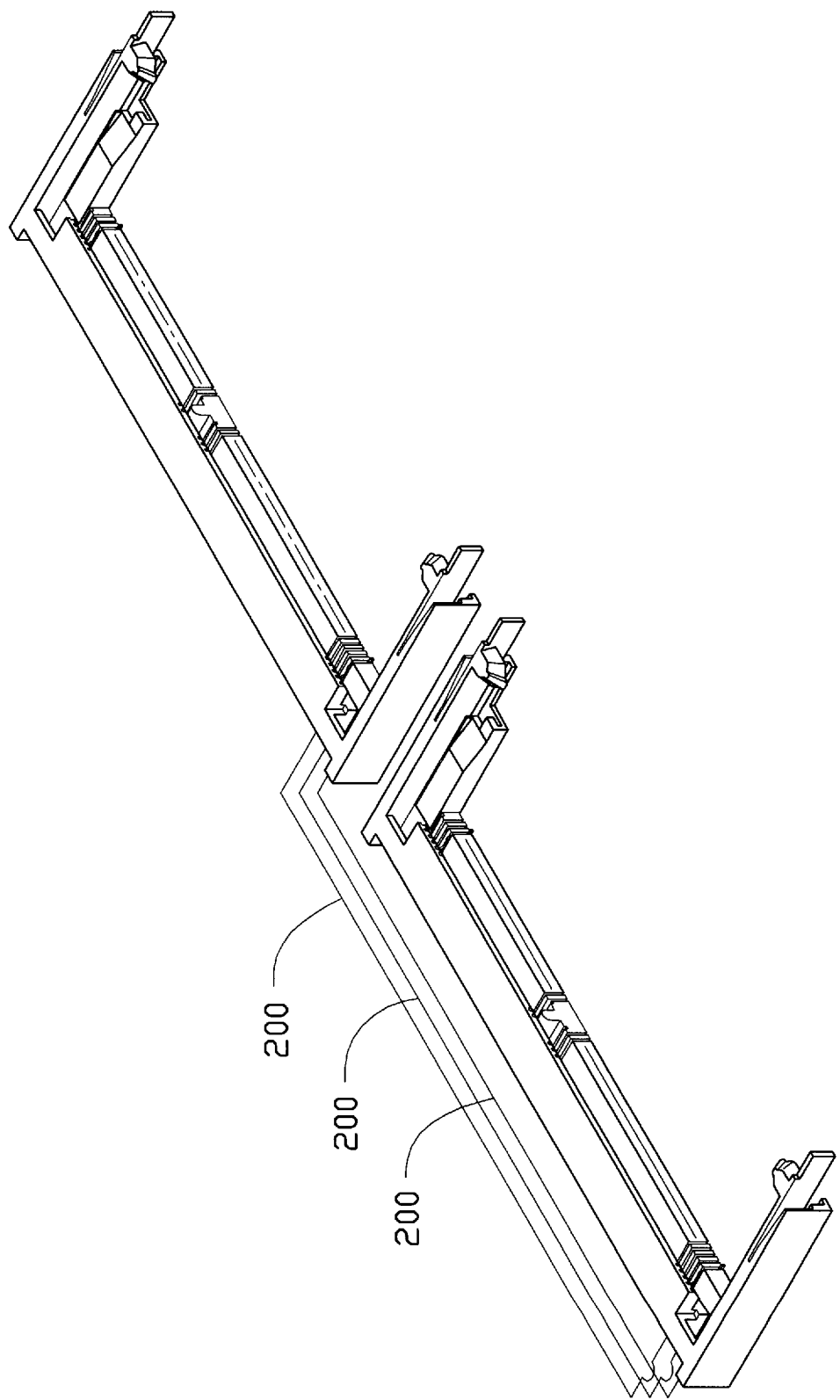
FIG. 2 is a perspective view of a pair of connectors side by side arranged with each other, according to the prior art.
Figure 3:
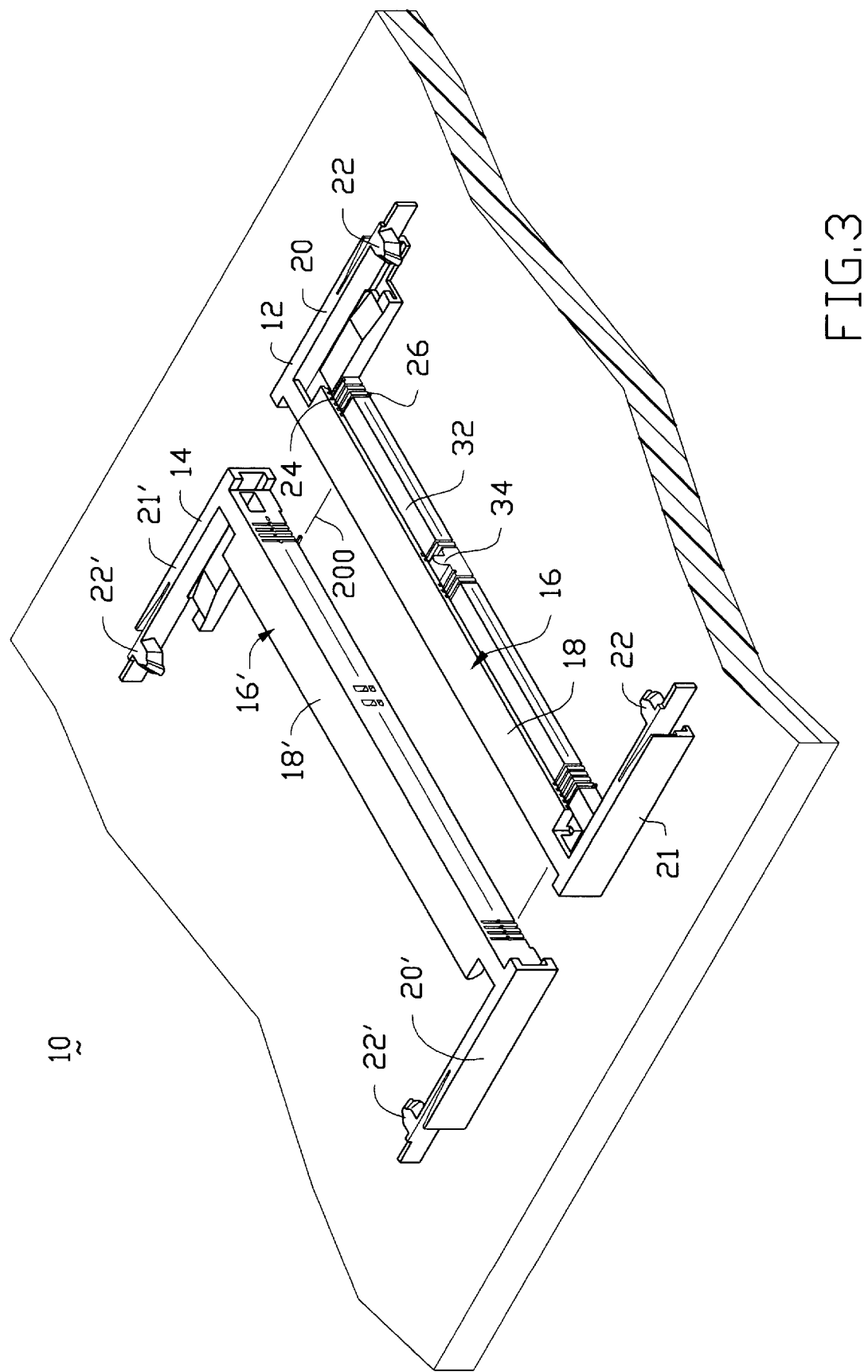
FIG. 3 is a presently preferred embodiment of a pair of connectors mounted on a PC board with a head-to-head relationship according to the invention.
Figure 3:
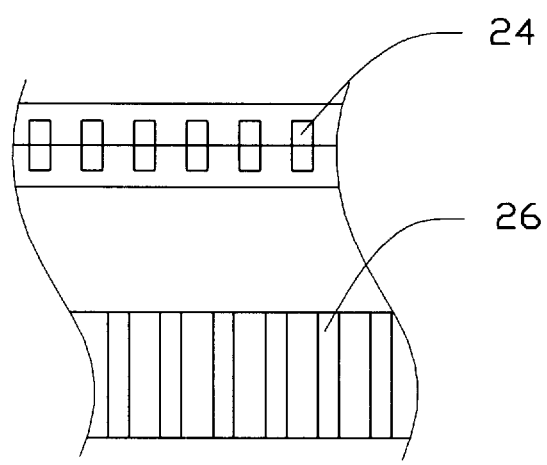
Figure 3:
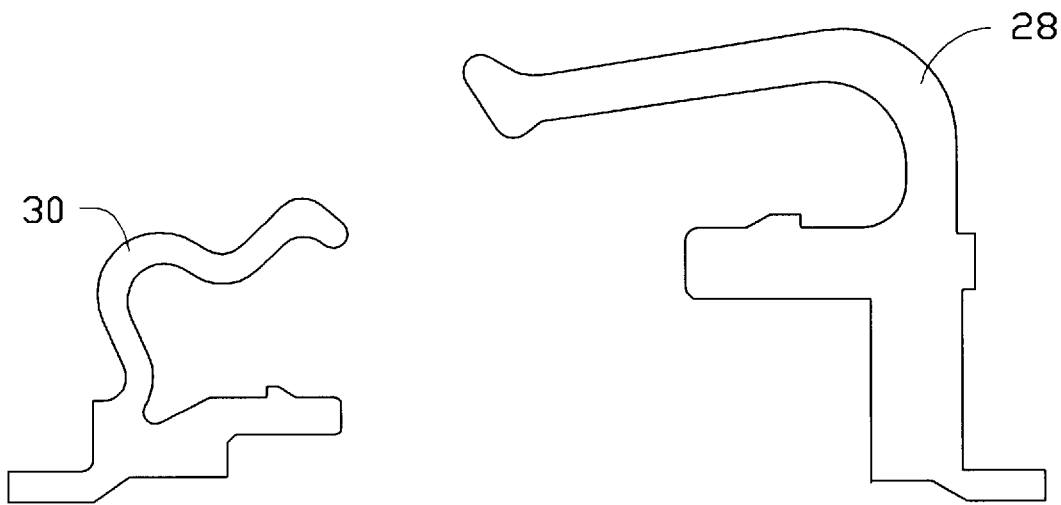
Figure 3:
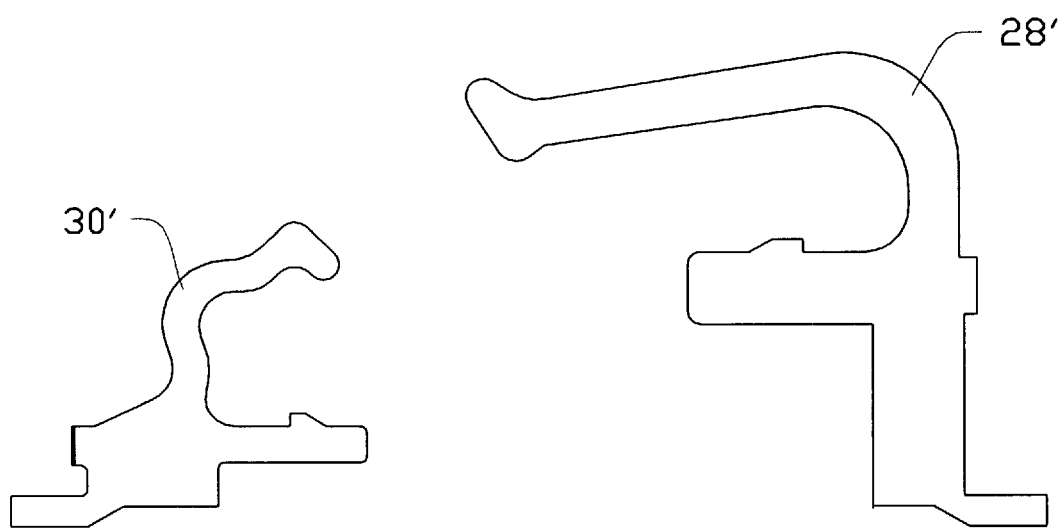
Figure 4:
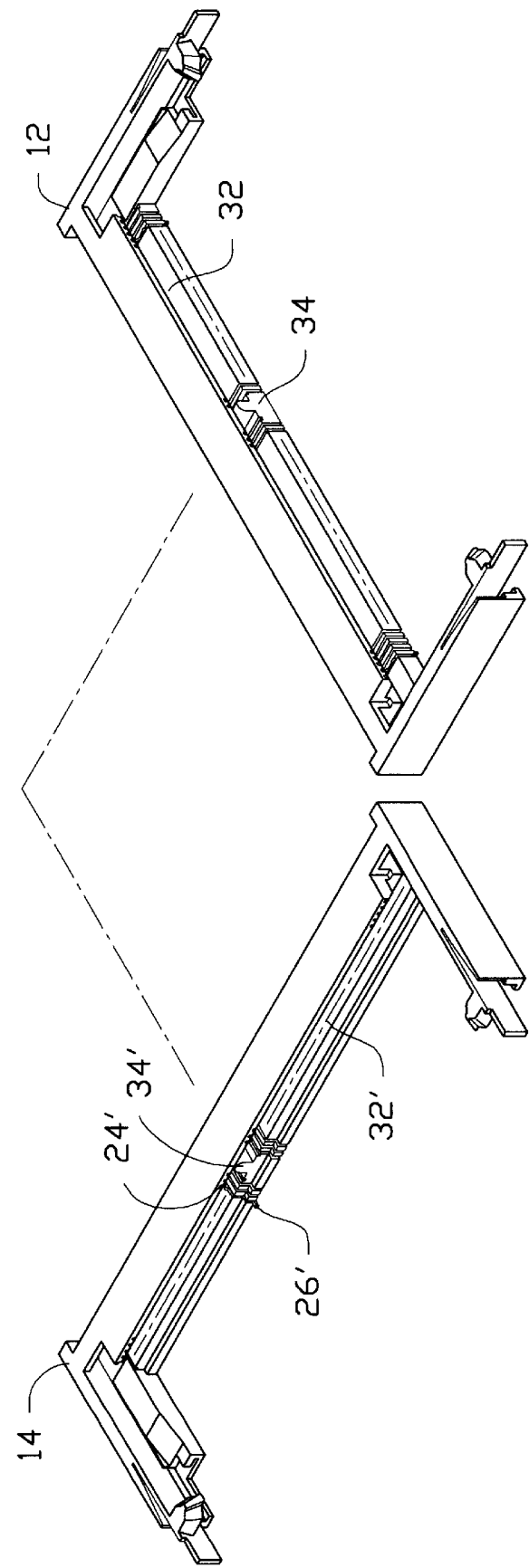
FIG. 4 is an exploded perspective view of the connectors of FIG. 3 to show the structures of the housing from the front side of the second connector for illustration.
Figure 5:
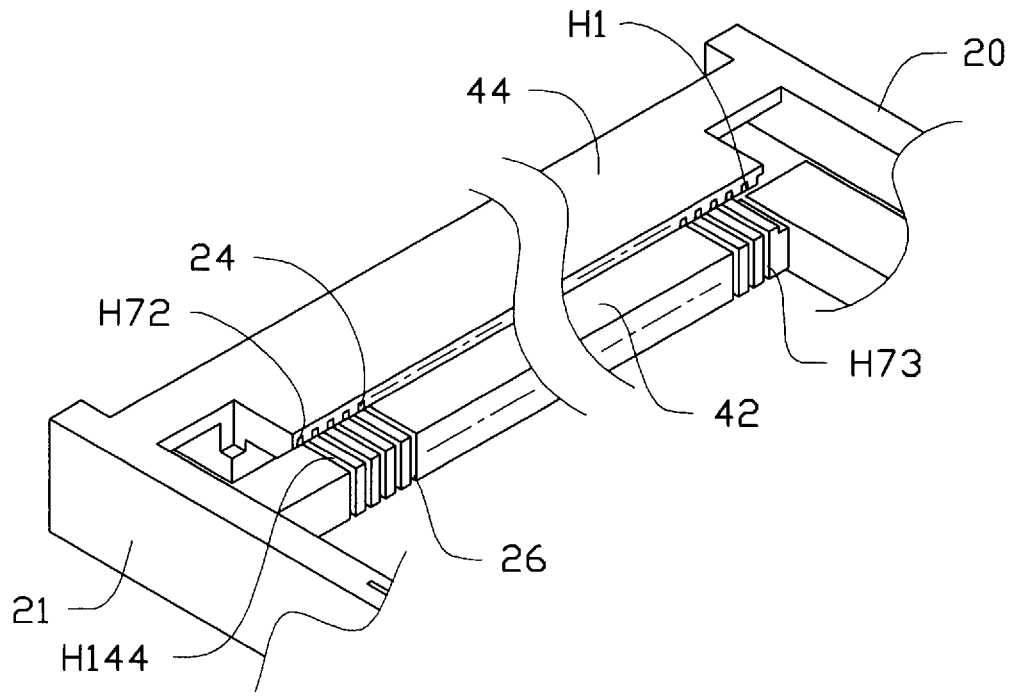
FIG. 5(A) is an enlarged partial perspective view of the first connector of FIG. 3.
FIG. 5(B) is an enlarged partial perspective view of the second connector of FIG. 3.
Figure 5:
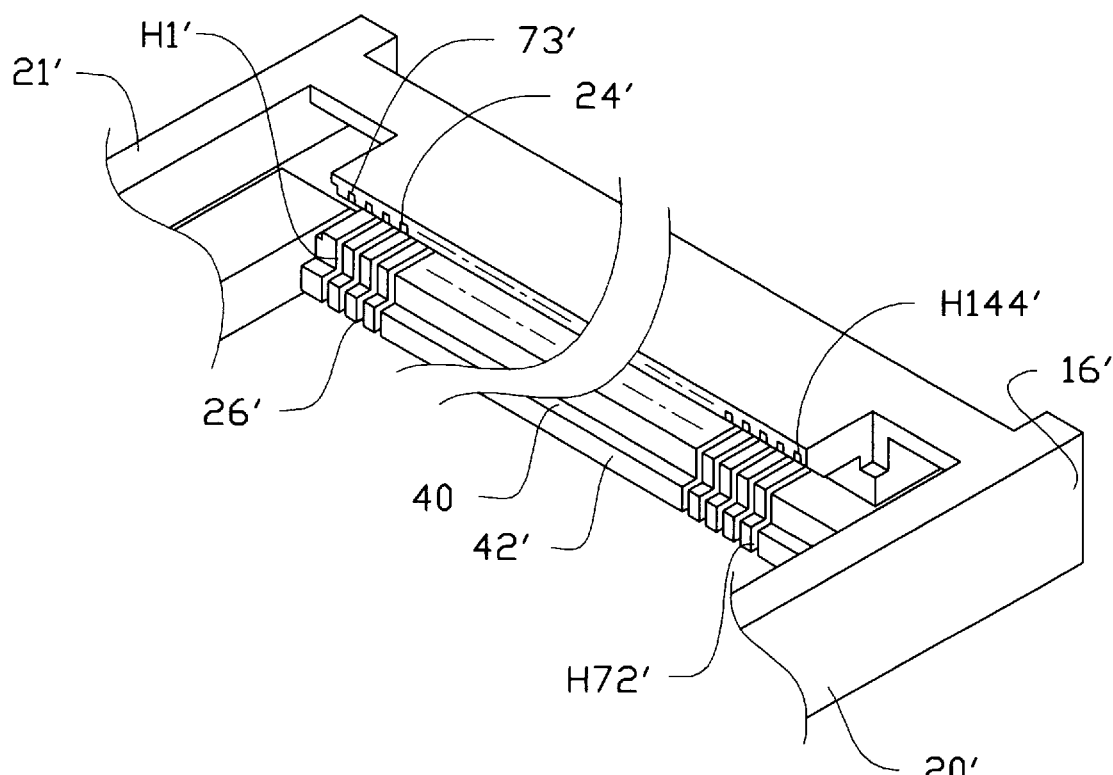

It will be noted here that for a better understanding, most of like components are designated by like reference numerals throughout the various figures in the embodiments. Attention is directed to FIGS. 3–5 wherein a system 10 for interconnecting two modules includes a first connector 12 and a second connector 14 each of which is adapted to receive a module 100 (FIG. 6) therein. The second connector 14 is positioned opposite to the first connector 12 in a head-to-head manner with the first connector 12 so that both these two connectors are generally aligned with each other in a front-to-end direction.

The first connector 12 includes a housing 16 having a main body 18 and two side arms and 21 extending rearward at two opposite ends of the main body 18 wherein each arm 20 further includes a latch 22 to cooperate with another opposite latch 22 for retaining the module 100 within the housing 16. Two rows, i.e., the upper row and the lower row, of passageways 24, 26 are disposed in the main body 18 wherein in each pair of passageways 24, 26 including upper passageway 24 in the upper row and the corresponding lower passageway 26 in the lower row, the upper passageway 24 is substantially offset to the right side of main body 18 in comparison with the corresponding lower passageway 26 (FIG. 3(A)). This arrangement is to meet the positions of the corresponding pads 102, 104 respectively printed on both surfaces 106, 108 of the module 100 wherein in each pair of pads 102, 104, which includes a first pad 102 on the first upper surface 106 and a second pad 104 on the second back surface 108, the first pad 102 is substantially offset to the right side with regard to the second pad 104.

Referring to FIG. 3(B), an upper contact 28 is positioned in each upper passageway 24 and a lower contact 30 is positioned in each lower passageway 26 for engagement with the corresponding pads 102, 104 of the module 100 inserted into a central slot 32 of the main body 18 of the housing 16.

A key 34 is formed on the right side of the central slot 32 of the main body 18 of the housing 12 to comply with a notch 110 on the front edge of the module 100 so as to prevent incorrect upside-down loading of the module 100 to the housing 12.

The first connector 12 generally is a standard product adapted to meet all the requirements of the standard module 100. The feature of the invention is to provide the second connector 14 which includes all the same structures as those in the first connector 12 except two matters illustrated later.

Thus, the second connector 14 includes a housing 16' having a main body 18' and two side arms 20' and 21' extending rearward at two opposite ends of the main body 18' wherein each arm further includes a latch 22' to cooperate with another opposite latch 22' for retaining the module 100 within the housing 16'. Two rows, i.e., the upper row and the lower row, of passageways 24' and 26' are disposed in the main body 18' (FIG. 4). An upper contact 28' is positioned in each upper passageway 24' and a lower contact 30' is positioned in each lower passageway 26' (FIGS. 3(C) and 4).

It can be seen that in the second connector 14, each pair of passageways 24' and 26' still follow the same offset manner as the first connector 12.

When used, the first connector 12 and the second connector 14 are oppositely and head-to-head aligned with each other in the front-to-end direction on the mother board, whereby a first module 100 can be inserted into the first connector 12 in a normal condition and a second module 100 can be inserted into the second connector 14 in an upside-down state.

Figure 6:
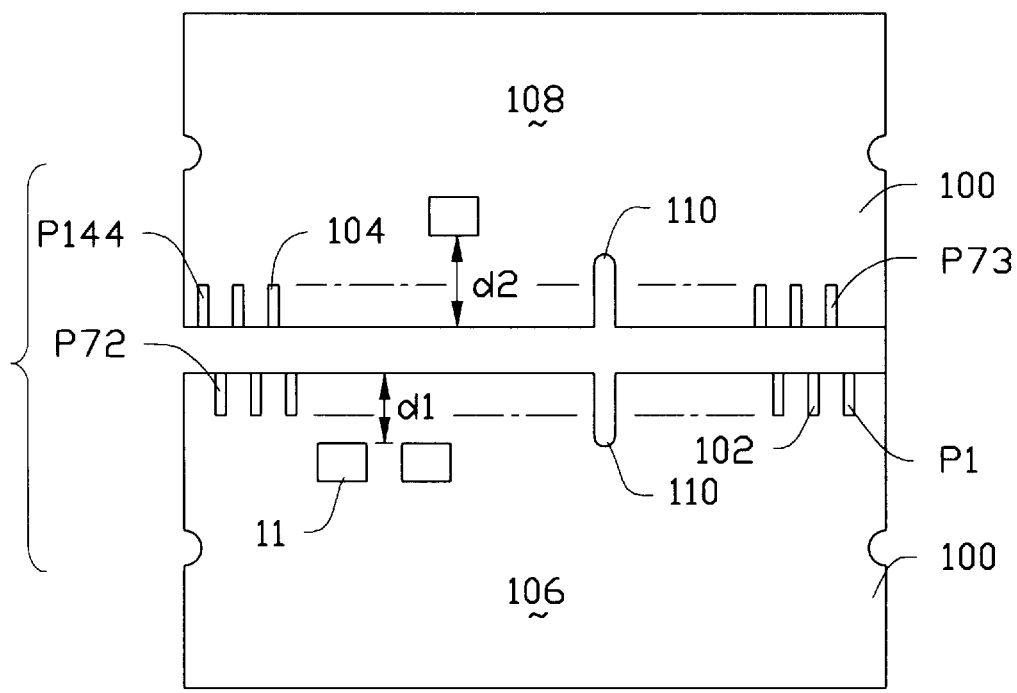
FIG. 6 is a plan view of a module for use with the connectors of FIG. 3 to show the upside and the downside thereof.

The following description can clearly illustrate the reason why the invention presents this method and the structure relationship of the corresponding passageways 24, 26 of the first connector 12 and the corresponding passageways 24', 26' of the second connector 14. Referring to FIG. 6, as shown, there are 144 different pads 102, 104 on two opposite surfaces 106, 108 of the module 100 wherein the pads 102 on the upper surface 106 of the module 100 are named P1–P72 and the pads 104 on the back surface 108 of the module 100 are named P73–P144, and wherein P1/P73 are a corresponding pair in a vertical direction even though the upper pad 102 is offset to the right side with regard to the lower pad 104 in the lengthwise direction. The remaining upper pads 102 and lower pads 104 also follow the same format. Correspondingly, as mentioned before, to each pair of passageways 24 and 26 of the first connector 12, the upper passageway 24 is offset to the right side in comparison with the corresponding lower passageway 26. Referring to FIGS. 5A and 5B, as shown, the upper passageways 24 and a lower passageways 26 are also named H1–H72 and H73–H144 wherein H1/H73 are a corresponding pair adapted to align with the corresponding P1/P73 of the module 100, and the rest of the upper and lower passageways 24, 26 are in the same arrangement for alignment with the corresponding pair of pads 102, 104. It can be seen that H1 in the first connector 12 is of the upper passageway 24 which is alignment with the corresponding P1 of the module 100.

Figure 7:
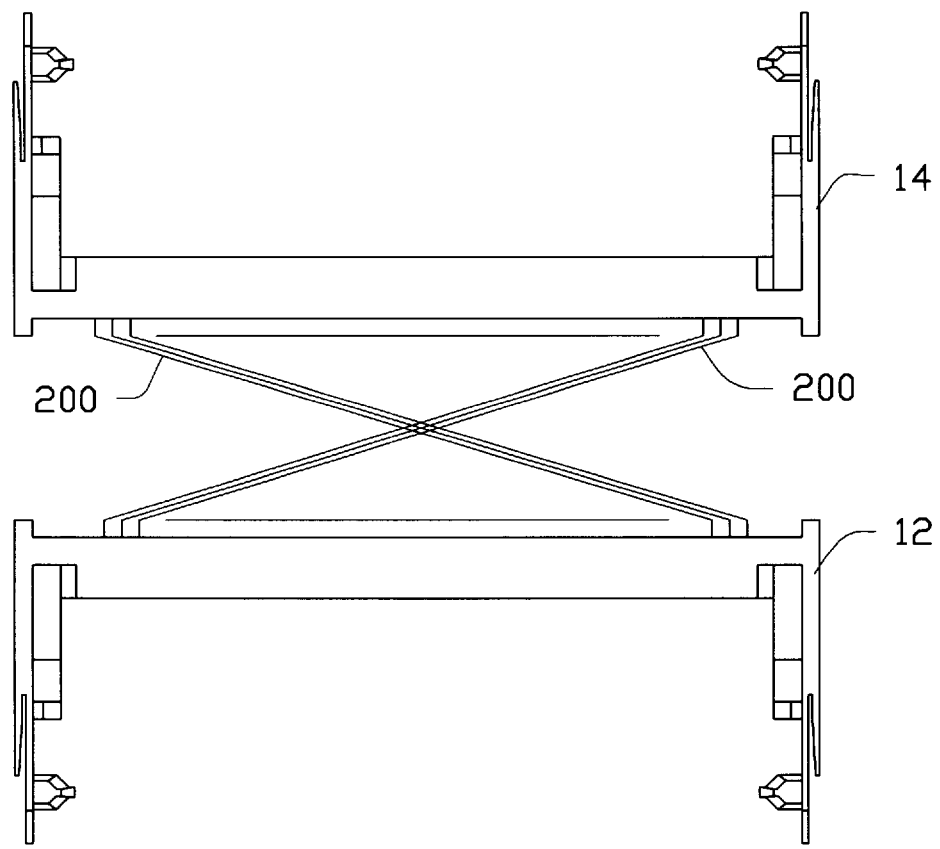
FIG. 7 is a plan view of a pair of connectors of FIG. 3 under a hypothetical situation that the second module is still in a normal upward facing manner within the second connector, to show how the corresponding traces are arranged on the PC board.
Figure 8:
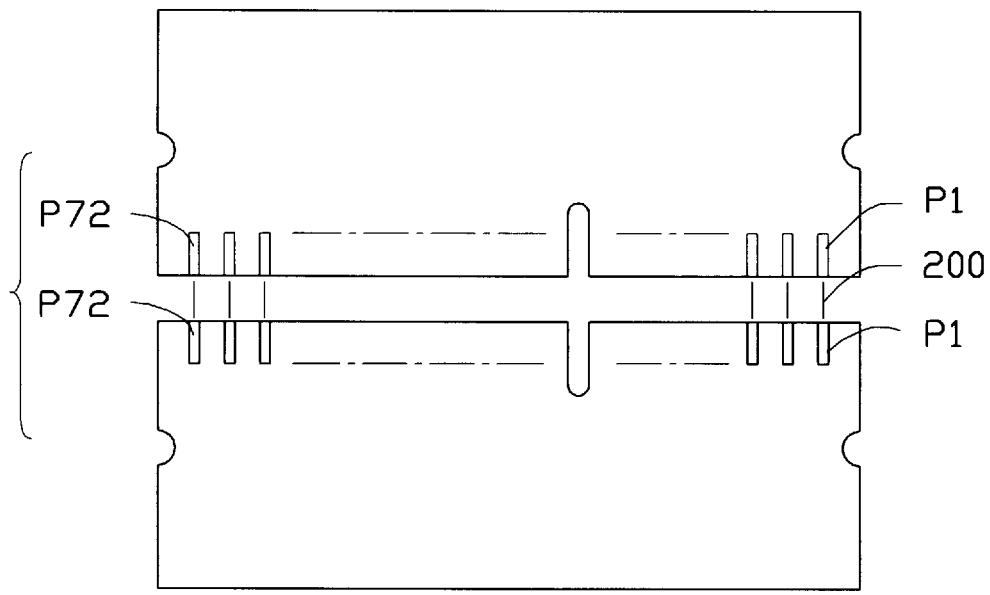
FIG. 8 is a plan view of the first module and the second module for use with the first connector and the second connector wherein both of the modules show their upside surface and the corresponding pads thereon, and how each trace electrically connected between the two corresponding pads.
Figure 9:
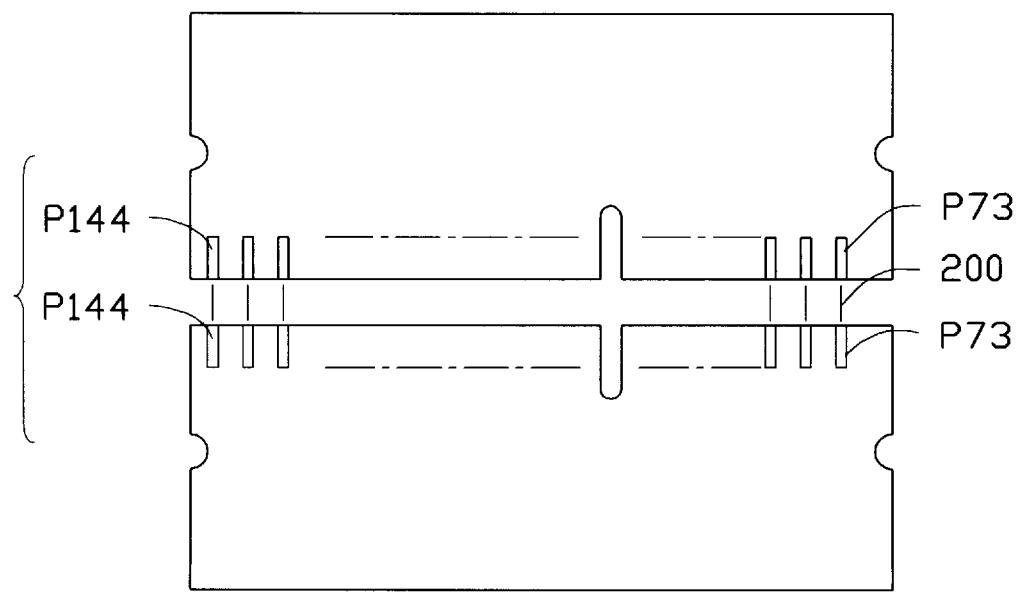
FIG. 9 is a plan view of the first module and the first module for use with the first connector and the second connector wherein both of the modules show their downside surface and the corresponding pads thereon, and how each trace electrically connected between the two corresponding pads.

As understood, the head-to-head arrangement of the two connectors 12, 14 is designed to reduce the length of the trace 200 which connects the one contact 28/30 of the first connector 12 and another contact 28'/30' of the second connector 14 wherein each of these two contacts 28/30 and 28'/30' substantially engages the same position pad 102/104 of the corresponding module 100, for example, P1, P2, . . . etc. Under this situation, if the second connector 14 still has the module 100 in the normal use, i.e., upper surface 106 facing up, the traces 200 which respectively connect pairs of the contact 28/30 of the first connector 12 and the contact 28'/30' of the second connector 14 can not help but be arranged in an intersection manner as shown in FIG. 7 (this being a hypothetical condition), thus resulting in not only complicating the manufacturing process for making such traces 200, but also generating the improper antenna effect during transmission.

This is the reason why the invention presents a new method having the second module 100', which is totally same with the first module 100, upside-down installed within the second connector 14 wherein as mentioned before, the second connector 14 generally is of a reverse type with regard to the first connector 12, which not only has the similar basic structure with the first connector but also has several differences to comply with the upside-down installation of the standard module 100.

Because the second module 100' is upside-down installed within the second connector 14, pad P1 of the first module 100 will be aligned with pad P1 of the upside-down second module 100' within the second connector 14 in the front-to-end direction due to the first connector 12 and the second connector 14 being oppositely aligned with each other. The remaining pairs of pads 102/104 of the first module 100 and the second module 100' also own the same characters. Therefore, the traces 200 electrically connecting corresponding pairs of pads 102/104 of the two modules 100 are naturally configured to parallel to each other and each trace 200 has a relatively shorter length thereof.

Based on the aforementioned requirements, different from the first connector 12, in the second connector 14, passageway H1', which is adapted to align with pad P1, is disposed in the lower passageway 26' because the second module 100' is designedly used in an upside-down manner. Therefore, in the second connector 14, the lower passageways 26' are defined as H1'–H72' and the upper passageways 24' are defined as H73'–H144' wherein H1'/H73' are a corresponding pair in the vertical direction, and the remaining upper and lower passageways 24' and 26' also follow this arrangement. Under this situation, it can be seen that in comparison with the first connector 12 in which passageway H1 starts is close to the right side arm and is of the upper passageway 24, the second connector 14 has its passageway H1' be close to the left side arm 21' and be of the lower passageway 26'. Accordingly, in this embodiment, the upper/lower contact 28/30 in the Nth (counted from the right side arm 20) upper/lower passageway 24/26 of the first connector 12 is electrically connected to the upper/lower contact 30'/28' of the Nth (counted from the left side arm 21') lower/upper passageway 24'/26' of the second connector 14 through the corresponding Nth trace 200 (counted from the right side of the mother board).

As mentioned before, to comply with the upside-down use of the second module 100' in the second connector 14, there are several structure differences between the first connector 12 and the second connector 14 other than the numeral definition such as H1 or H1' with regard to their upper or lower passageways 24/26 or 24'/26'. The first difference is that the key 34' of the second connector 14 is formed on the left side of the central slot 32' wherein the distance from the left side key 34' to the center line in the second connector 14 is substantially equal to that from the right key 34' to the center line in the first connector 12. This is because the notch 110 of the module 100 is set on the right side thereof, and thus the second connector 14 should have its key 34' set opposite to the first connector 12.

The second difference is that a recess 40 is formed on the lower portion 42' of the housing 16' adjacent the second passageways 26'. It is understood that because, to the module 100 or 100', the upper surface 106 and the back surface 108 generally have the same layout arrangement for the corresponding pads 102/104 and the edge notches 110 except one thing, this is the reason why the second module 100' can be upside-down used in the second connector 14. The layout difference between the upper surface 106 and the back surface 108 is that there is a 3.2 mm clearance distance d1 between the outermost edge of the electrical components 112 mounted on the upper surface 106 but is a 4.0 mm clearance distance d2 between the outermost edge of the electrical component 114 mounted on the lower surface 108. This requirements originally complies with the standard connector as the first connector 12 having a larger dimensioned lower portion 42 than the upper portion 44, for not interference occurring therebetween. In the invention, because the second connector 14 is adapted to receive the upside-down module 100, there should be such recess 40 in the lower portion 42' of the housing 16' for avoid possibly interfering with the components 112 on the upper surface 102 of the module 100.

Accordingly, referring to FIGS. 3(B) and 3(C), to comply with the recess 40, the shape of the lower contact 30' in the lower passageway 26' of the second connector 14 may have somewhat difference to that of the lower contact 30 of the first connector 12.

It can be appreciated that the invention presents not only a newly designed connector 14. which is different from the standard connector 12, for receiving an upside-down loaded standard module 100, but also a system using a pair of connectors 12, 14, i.e., one being standard connector 12 and the other being a reversed-type connector 14, to respectively receive two standard modules 100 therein.

It can be contemplated that the traces 200 are aligned with the corresponding passageways 24/26 of the first connector 12 and passageways 26'/24' of the second connector 14, and substantially electrically engaged with the corresponding contacts 28/30 and 30'/28' in the first and the second connectors 12, 14. Thus, the modules 100 can be electrically connected to the CPU chip, which generally is mounted on the back of the mother board, through the corresponding contacts 28/30 and 28'/30' and traces 200.

It is also noted that the invention provides an arrangement that the Nth pad 102/104 on the upper/back surface 106/108 of the module (counted from the right side of the upper surface 106, is adapted to engage with the Nth upper/lower contact 24/26 of the first connector 12 (counted from the right side arm of the first connector 12), while is adapted to engage with the Nth lower/upper contacts 26'/24' of the second connector 14 (counted from the left side arm 21' of the second connector 14.

While the present invention has been described with reference to specific embodiments, the description is illustrative of the invention and is not to be construed as limiting the invention. Various modifications to the present invention can be made to the preferred embodiments by those skilled in the art without departing from the true spirit and scope of the invention as defined by the appended claims.

Therefore, person of ordinary skill in this field are to understand that all such equivalent structures are to be included within the scope of the following claims.

We claim:

1. A system for arranging a first connector and a second connector which are adapted to receive a first and a second modules therein, comprising:

said first connector including a first main body with first contacts therein, and a first central slot for receiving said first module therein, a pair of first side arms extending rearward from two opposite ends of the first main body; and said second connector including a second main body with second contacts therein, and a second central slot for receiving said second module therein, a pair of second side arms extending rearward from two opposite ends of the second main body; wherein said first connector and said second connector are oppositely aligned with and spaced from each other in a front-to-end direction, while commonly mounted on a mother board wherein the pair of first side arms and the pair of second side arms extend in opposite directions with each other.

2. The system as defined in claim 1, wherein the first module and the second module are substantially identical to each other each defining a first surface and an opposite second surface, and the first module is adapted to be inserted into the first connector in a manner with the first surface thereof facing upward and the second module is adapted to be inserted into the second connector in an upside-down manner with the second surface thereof facing upward.

3. The system as defined in claim 1, wherein a plurality of traces are provided to respectively connect pairs of contacts of which one contact is in the first connector and the other contact is in the second connector.

4. The system as defined in claim 3, wherein said each pair of contacts includes one contact in an upper passageway in one connector, and the other contact in a lower passageway in the other connector.

5. The system as defined in claim 3, wherein the traces are parallel with each other and extend along said front-to-end direction.

6. The system as defined in claim 1, wherein the first connector includes a first key which is opposite to a second key of the second connector in said front-to-end direction.

7. The system as defined in claim 1, wherein the second connector includes an elongated recess formed along a lower portion of the second main body.

8. A connector which is generally of a reversed type compared to a standard connector including a standard main body having a standard key in a standard central slot for receiving a module therein, said standard key being spaced from a central line of said standard main body with a first distance, a first and a second standard side arms respectively extending rearward from two opposite ends of the standard main body, comprising:

a housing including a main body having substantially a same length with regard to the standard main body of the standard connector and defining upper row passageways and lower row passageways for receiving a plurality of upper contacts and lower contacts therein, respectively, and a first and a second side arms respectively extending rearward from two opposite ends of the main body;

said housing defining a central slot for receiving a module therein;

a reverse key positioned in said central slot and spaced from a central slot of said main body with a second distance wherein the standard key is located close to the first standard side arm of the standard connector while the reverse key is located close to the second side arm of the connector, and the first distance is substantially equal to the second distance whereby the module, which is adapted to be received within the standard connector can be received within the central slot of the housing in an upside-down manner.

9. The connector as defined in claim 8, wherein a space is provided on a lower portion of the main body of the connector in comparison with the standard connector in order not to interfere with components on a back surface of the module.

10. An electrical connector assembly, comprising:

a first connector including a housing having a main body defining first upper row passageways and first lower row passageways for receiving a plurality of first upper contacts and first lower contacts, respectively;

a module adapted to be received within a second connector which is a standard connector having second upper row passageways and second lower row passageways for receiving a plurality of second upper contacts and second lower contacts so as to engage with corresponding pads printed on an upper surface and a back surface of the module;

said module being received within the housing in an upside-down status wherein each pad, which is printed on the upper surface of the module and positioned on a right side thereof and is adapted to engage with one second upper contact on a right side of the second connector, is substantially engaged with one first lower contact on a left side of the first connector; in contrast, each pad, which is printed on the back surface of the module and positioned on a left side thereof and is adapted to engage with one second lower contact on the left side of the second connector, is substantially engaged with one first upper contact on the right side of the first connector.

11. A method for upside-down installing a module into a connector wherein said module has a notch positioned on a right side with a first distance from a center line thereof when the module has an upper surface thereof face up and a plurality of pads on both upper and back surfaces of the module, the steps comprising:

providing said connector with a key positioned on a left side with a second distance from another center line thereof wherein the first distance is equal to the second distance; and providing said connector with first set of upper contacts and a second set of lower contacts divided by a central slot which is adapted to receive therein the module wherein the module is installed within the connector with a back surface thereof facing up, and the upper contacts engage with the pads on the back surface of the module and the lower contacts engage with the pads on the upper surface of the module.

12. The method as defined in claim 11, wherein the connector is provided with an additional space around the lower portion of the main body adjacent the lower contacts so as not to interfere with components mounted on the upper surface of the module.

\* \* \* \* \*

(12) EX PARTE REEXAMINATION CERTIFICATE (9268th)
United States Patent
Choy et al.

(10) Number: US 5,882,211 C1
(45) Certificate Issued: Sep. 4, 2012

(54) SYSTEM FOR ARRANGING A PAIR OF OPPOSITE CONNECTORS

(75) Inventors: Edmond Choy, Union City, CA (US); Caesar Chen, Fountain Valley, CA (US)

(73) Assignee: Xerox Corporation, Rochester, NY (US)

Reexamination Request:
No. 90/009,885, Mar. 24, 2011

Reexamination Certificate for:
Patent No.: 5,882,211
Issued: Mar. 16, 1999
Appl. No.: 08/858,218
Filed: May 10, 1997

(51) Int. Cl.
*H01R 9/09* (2006.01)

(52) U.S. Cl. .................. 439/74; 439/540.1; 439/633
(58) Field of Classification Search .................. None
See application file for complete search history.

(56) References Cited

To view the complete listing of prior art documents cited during the proceeding for Reexamination Control Number 90/009,885, please refer to the USPTO's public Patent Application Information Retrieval (PAIR) system under the Display References tab.

*Primary Examiner* — Minh T Nguyen

(57) ABSTRACT

A system (10) for interconnecting two modules (100, 100') to the CPU chip, includes two opposite connectors (12, 14) in a head-to-head arrangement. The traces (200) each of which connects the two corresponding contacts 28/30 and 30'/28' each being located in the same position of the corresponding connector (12, 14), are generally arranged in a parallel relationship. One (12) of the connectors (12, 14) is substantially a standard one which meets the requirements defined in the general specification. The other (14) of the connectors (12, 14) is generally, but not exactly, of a mirror image with regard to the first one (12), wherein the positions of the two-row contacts (28'/30') with regard to the housing (16') along the lengthwise direction of the second connector (14) are arranged in an opposite relationship with regard to those in the first connector (12). When used, a standard module (100) can be inserted into the first connector (12) in a common way with its upside surface (106) facing up, or can be inserted into the second connector (14) in an opposite way with its back surface (108) facing up, whereby the pads (P1-P144) printed on both surfaces (106, 108) of the module (100, 100') can be respectively properly electrically connected to the corresponding traces (200) regardless of which connector (12, 14) it is inserted into.

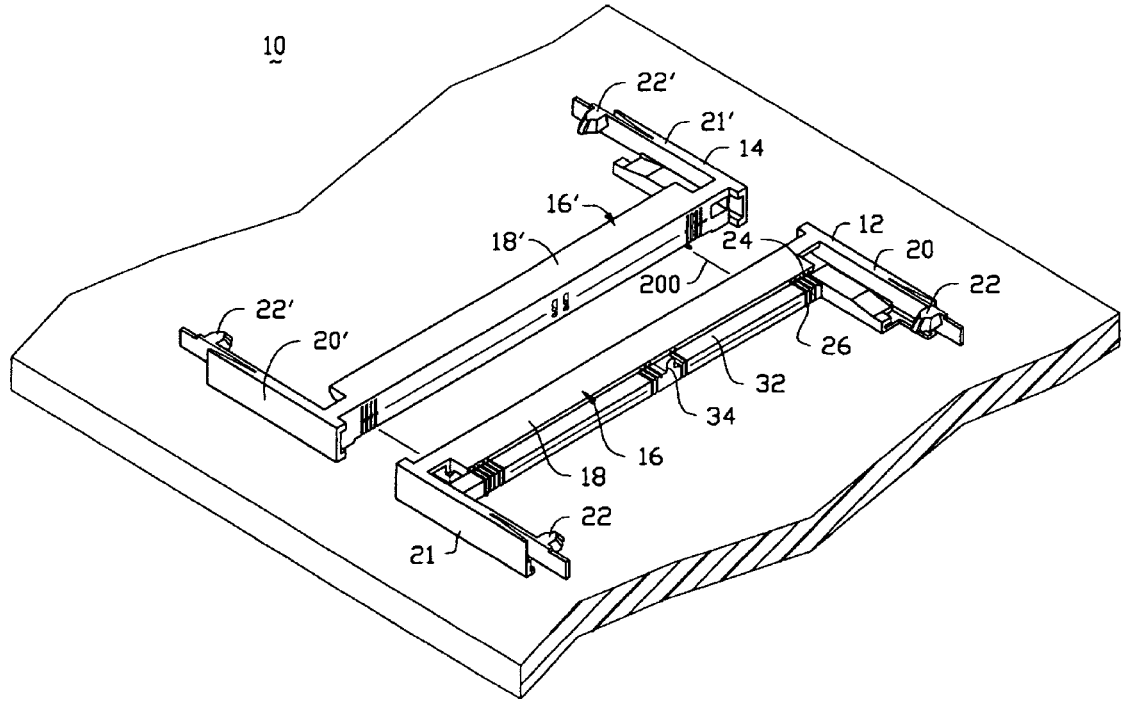

EX PARTE REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claims 2-4, 8-9 and 11-12 are cancelled.

Claims 1 and 10 are determined to be patentable as amended.

Claims 5-7, dependent on an amended claim, are determined to be patentable.

New claims 13-14 are added and determined to be patentable.

1. A system for arranging a first *SO DIMM (Small Out-line Dual In-line Memory Module)* connector and a second *SO DIMM* connector which are adapted to receive a first and a second *SO DIMM* modules therein, comprising:
   said first connector including a first main body with first contacts therein, and a first central slot for receiving said first module therein, a pair of first side arms extending rearward from two opposite ends of the first main body; and
   said second connector including a second main body with second contacts therein, and a second central slot for receiving said second module therein, a pair of second side arms extending rearward from two opposite ends of the second main body; wherein
   said first connector and said second connector are oppositely aligned with and spaced from each other in a front-to-end direction, while commonly mounted on a mother board wherein the pair of first side arms and the pair of second side arms extend in opposite directions with each other; *wherein*
   *the first module and the second module are substantially identical to each other, each defining a first surface and an opposite second surface, and the first module is adapted to be inserted into the first connector in a manner with the first surface thereof facing upward and the second module is adapted to be inserted into the second connector in an upside-down manner with the second surface thereof facing upward; wherein*
   *a plurality of traces are provided to respectively connect pairs of contacts which one contact is in the first connector and the other contact is in the second connector; wherein*
   *said each pair of contacts includes one contact in an upper passageway in one connector, and the other contact in a lower passageway in the other connector.*

10. An electrical connector assembly, comprising:
    a first *SO DIMM (Small Out-line Dual In-line Memory Module)* connector including a housing having a main body defining first upper row passageways and first lower row passageways for receiving a plurality of first upper contacts and first lower contacts, respectively;
    [a] *an SO DIMM* module adapted to be received within a second *SO DIMM* connector which is a standard connector having second upper row passageways and second lower row passageways for receiving a plurality of second upper contacts and second lower contacts so as to engage with corresponding pads printed on an upper surface and a back surface of the module;
    said module being received within the housing in an upside-down status wherein each pad, which is printed on the upper surface of the module and positioned on a right side thereof and is adapted to engage with one second upper contact on a right side of the second connector, is substantially engaged with one first lower contact on a left side of the first connector; in contrast, each pad, which is printed on the back surface of the module and positioned on a left side thereof and is adapted to engage with one second lower contact on the left side of the second connector, is subtantially engaged with one first upper contact on the right side of the first connector; *wherein*
    *said upper contacts are discrete and differently shaped from the lower contacts.*

13. *The system as defined in claim 1, wherein said one connector further includes a lower passageway receiving a corresponding contact which is discrete and differently shaped fom the contact in the upper passageway in said one connector.*

14. *The system as defined in claim 1, wherein said other connector further includes a lower passageway receiving a corresponding contact which is discrete and differently shaped from the contact in the lower passageway in said other connector.*

\* \* \* \* \*